(12) United States Patent
Shih et al.

(10) Patent No.: US 12,113,544 B2
(45) Date of Patent: Oct. 8, 2024

(54) SINGLE-ENDED TO DIFFERENTIAL-ENDED CONVERTER CIRCUIT, SUCCESSIVE-APPROXIMATION REGISTER ANALOG-TO-DIGITAL CONVERTER UTILIZING SAME, AND METHOD OF CONVERTING SINGLE-ENDED SIGNAL TO DIFFERENTIAL-ENDED SIGNAL

(71) Applicant: REALTEK SEMICONDUCTOR CORPORATION, Hsinchu (TW)

(72) Inventors: Sheng-Yen Shih, Hsinchu (TW); Shih-Hsiung Huang, Hsinchu (TW); Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 168 days.

(21) Appl. No.: 17/864,464

(22) Filed: Jul. 14, 2022

(65) Prior Publication Data
US 2023/0134950 A1    May 4, 2023

(30) Foreign Application Priority Data

Nov. 3, 2021  (TW) .................................. 110140917

(51) Int. Cl.
*H03M 1/00* (2006.01)
*H03M 1/12* (2006.01)
(Continued)

(52) U.S. Cl.
CPC ........... *H03M 1/38* (2013.01); *H03M 1/1245* (2013.01); *H03M 3/04* (2013.01)

(58) Field of Classification Search
CPC ......... H03M 1/38; H03M 1/1245; H03M 1/04
(Continued)

(56) References Cited

U.S. PATENT DOCUMENTS

| 2013/0169454 A1 | 7/2013 | Debnath et al. |
| 2013/0214948 A1* | 8/2013 | Nicollini ............. G11C 27/026 |
| | | 327/54 |
| 2019/0190526 A1* | 6/2019 | Iguchi ................. H03M 1/1245 |

OTHER PUBLICATIONS

OA letter of a counterpart TW application (appl. No. 110140917) mailed on Jun. 2, 2022. Summary of the TW OA letter. Claim(s) 1-10 is/are rejected under Patent Law Article 22(2) as being unpatentable over reference 1 (US2013/0169454 A1). Claim correspondence between the TW counterpart application and the instant US application: Claims 1-10 in the TW counterpart application correspond to claims 1-8 and 11-12 in the instant US application, respectively.

* cited by examiner

*Primary Examiner* — Peguy Jean Pierre
(74) *Attorney, Agent, or Firm* — WPAT, P.C.

(57) ABSTRACT

A method of converting a single-ended signal to a differential-ended signal includes the following steps: providing a first sampling capacitor having a first end and a second end; providing a second sampling capacitor having a third end and a fourth end; at a first time point, controlling the first end to receive a single-ended signal, controlling the second end to receive a reference voltage, controlling the third end to receive the reference voltage or a middle voltage value of the swing of the single-ended signal, and controlling the fourth end to receive the single-ended signal; and at a second time point, controlling the second end and the fourth end to receive the reference voltage. The first end and the third end output a differential signal after the second time point which is later than the first time point.

11 Claims, 9 Drawing Sheets

(51) Int. Cl.
*H03M 1/38* (2006.01)
*H03M 3/04* (2006.01)

(58) Field of Classification Search
USPC .................................. 343/155, 122, 161, 143
See application file for complete search history.

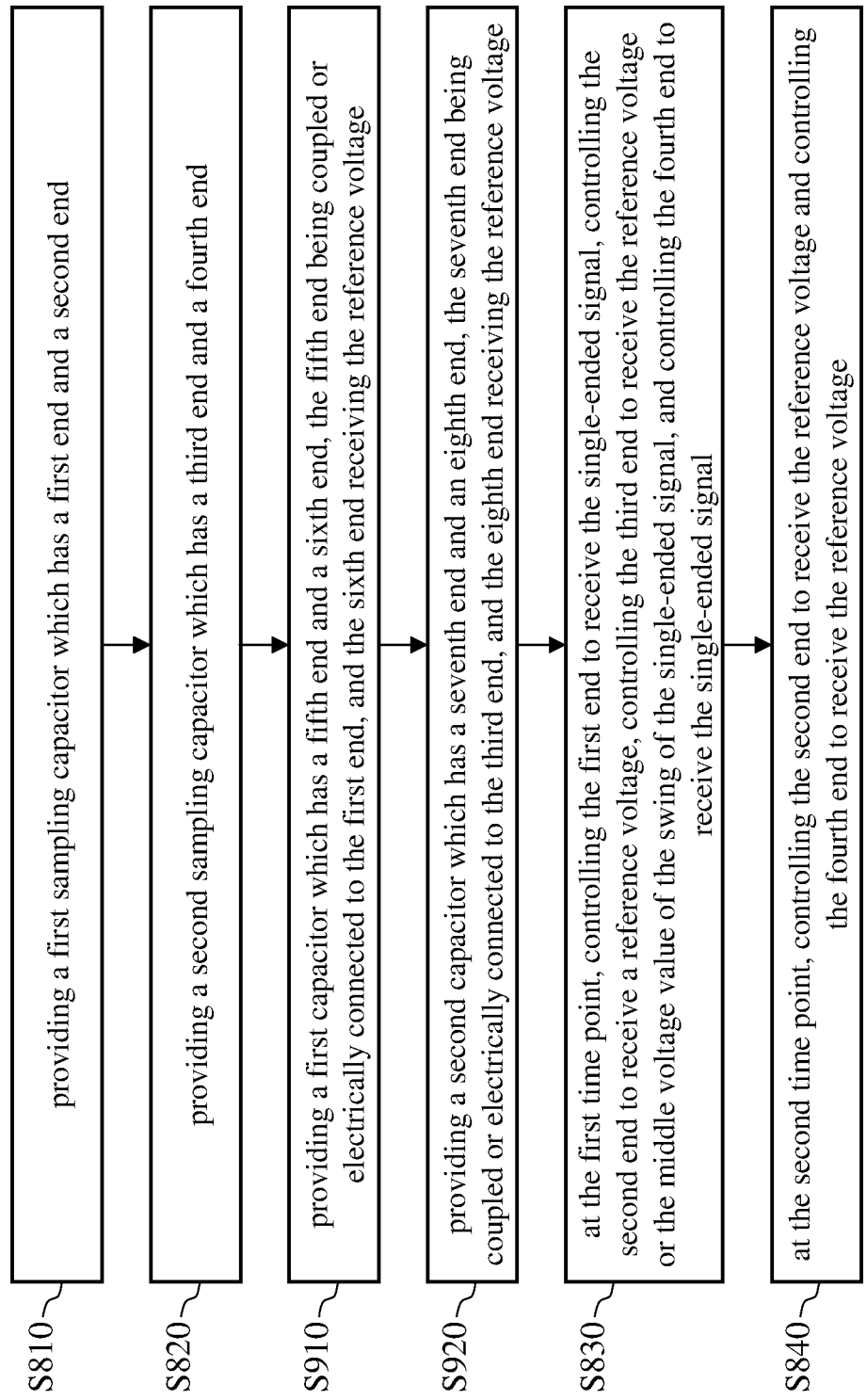

SINGLE-ENDED TO DIFFERENTIAL-ENDED CONVERTER CIRCUIT, SUCCESSIVE-APPROXIMATION REGISTER ANALOG-TO-DIGITAL CONVERTER UTILIZING SAME, AND METHOD OF CONVERTING SINGLE-ENDED SIGNAL TO DIFFERENTIAL-ENDED SIGNAL

BACKGROUND OF THE INVENTION

1. Field of the Invention

The present invention generally relates to single-ended signals and differential-ended signals (also referred to as differential signals), and, more particularly, to circuits and methods of converting a single-ended signal to a differential-ended signal and an analog-to-digital converter (ADC) utilizing a single-ended to differential-ended converter circuit.

2. Description of Related Art

Even though differential signals are widely used in modern electronic components, single-ended signals can still be seen. The swing of single-ended signals is only half the swing of differential signals, and the single-ended signals are susceptible to noises. The conversion of single-ended signals into differential signals is helpful in improving the performance of electronic components and thus plays an important role in this technical field.

SUMMARY OF THE INVENTION

In view of the issues of the prior art, an object of the present invention is to provide single-ended to differential-ended converter circuits and methods of converting a single-ended signal to a differential-ended signal, so as to make an improvement to the prior art.

According to one aspect of the present invention, a single-ended to differential-ended converter circuit is provided. The single-ended to differential-ended converter circuit receives a single-ended signal and outputs a differential signal at a first output node and a second output node. The single-ended to differential-ended converter circuit includes a first sampling capacitor, a second sampling capacitor, and a switch group. The first sampling capacitor has a first end and a second end. The first end is coupled to the first output node, and the second end receives a reference voltage. The second sampling capacitor has a third end and a fourth end. The third end is coupled to the second output node. The switch group is coupled to the first output node, the second output node, and the fourth end. At a first time point, the switch group couples the first output node and the first end to the single-ended signal, couples the second output node and the third end to the reference voltage or a middle voltage value of a swing of the single-ended signal, and couples the fourth end to the single-ended signal. At a second time point, the switch group couples the fourth end to the reference voltage. The differential signal is outputted after the second time point which is later than the first time point.

According to another aspect of the present invention, a successive-approximation register (SAR) analog-to-digital converter (ADC) is provided. The SAR ADC includes a comparator, a SAR, a first sampling capacitor, a second sampling capacitor, a first capacitor group, a first switch group, a second capacitor group, a second switch group, a control circuit, and a third switch group. The comparator has a first input terminal and a second input terminal and configured to generate a comparison result. The SAR is coupled to the comparator and configured to store the comparison result. The first sampling capacitor has a first end and a second end. The first end is coupled to the first input terminal, and the second end receives a reference voltage. The second sampling capacitor has a third end and a fourth end. The third end is coupled to the second input terminal. The first capacitor group includes a plurality of first capacitors, and an end of the first capacitors is coupled to the first input terminal. The first switch group coupled to another end of the first capacitors. The second capacitor group includes a plurality of second capacitors, and an end of the second capacitors is coupled to the second input terminal. The second switch group is coupled to another end of the second capacitors. The control circuit is coupled to the SAR and configured to control the first switch group and the second switch group according to the comparison result. The third switch group is coupled to the first input terminal, the second input terminal, and the fourth end. At a first time point, the third switch group couples the first input terminal and the first end to a single-ended signal, couples the second input terminal and the third end to the reference voltage or a middle voltage value of a swing of the single-ended signal, and couples the fourth end to the single-ended signal. The third switch group couples the fourth end to the reference voltage at a second time point which is later than the first time point.

According to still another aspect of the present invention, a method of converting a single-ended signal to a differential signal is provided. The method includes the following steps: providing a first sampling capacitor which has a first end and a second end; providing a second sampling capacitor which has a third end and a fourth end; at a first time point, controlling the first end to receive the single-ended signal, controlling the second end to receive a reference voltage, controlling the third end to receive the reference voltage or a middle voltage value of a swing of the single-ended signal, and controlling the fourth end to receive the single-ended signal; and at a second time point, controlling the second end to receive the reference voltage and controlling the fourth end to receive the reference voltage. The first end and the third end output the differential signal after the second time point which is later than the first time point.

According to the present invention, the single-ended to differential-ended converter circuits and the methods of converting a single-ended signal to a differential-ended signal increase the signal swing by converting the single-ended signal to a differential signal, thereby increasing the signal-to-noise ratio (SNR) of the signal and improving the performance of electronic components (e.g., successive-approximation register (SAR) ADCs).

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 9 is a flowchart of a method of converting a single-ended signal to a differential-ended signal according to another embodiment of the present invention.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes single-ended to differential-ended converter circuits, SAR ADCs utilizing the single-ended to differential-ended converter circuit, and methods of converting a single-ended signal to a differential-ended signal. On account of that some or all elements of the single-ended to differential-ended converter circuits and the SAR ADCs utilizing the single-ended to differential-ended converter circuit could be known, the detail of such elements is omitted provided that such detail has little to do with the features of this disclosure, and that this omission nowhere dissatisfies the specification and enablement requirements. The methods of converting a single-ended signal to a differential-ended signal can be performed by the single-ended to differential-ended converter circuits or their equivalents. A person having ordinary skill in the art can choose components or steps equivalent to those described in this specification to carry out the present invention, which means that the scope of this invention is not limited to the embodiments in the specification.

Figure 1B:
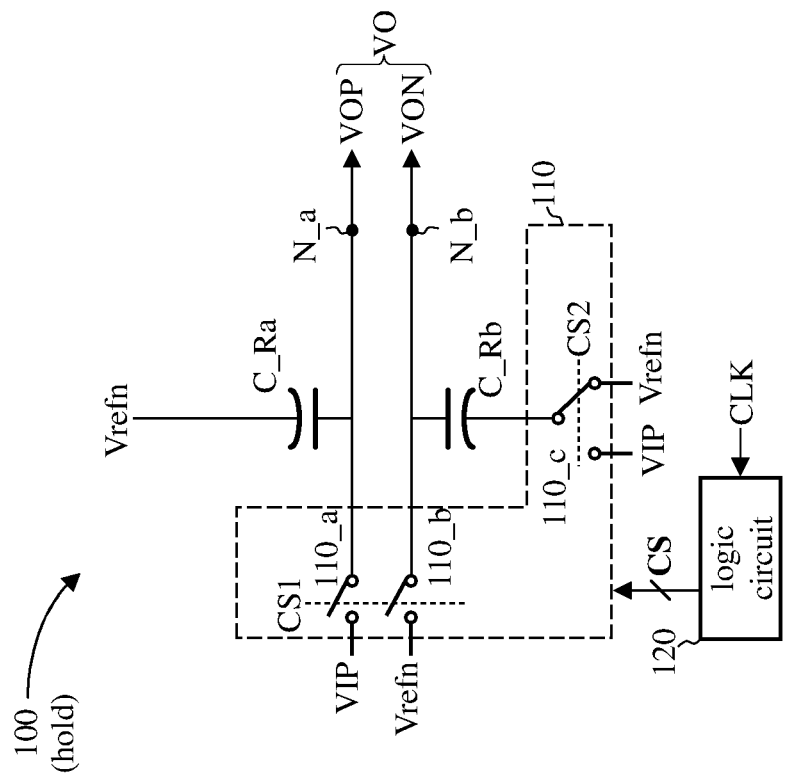
FIGS. 1A and 1B are circuit diagrams of a single-ended to differential-ended converter circuit according to an embodiment of the present invention.
Figure 1A:
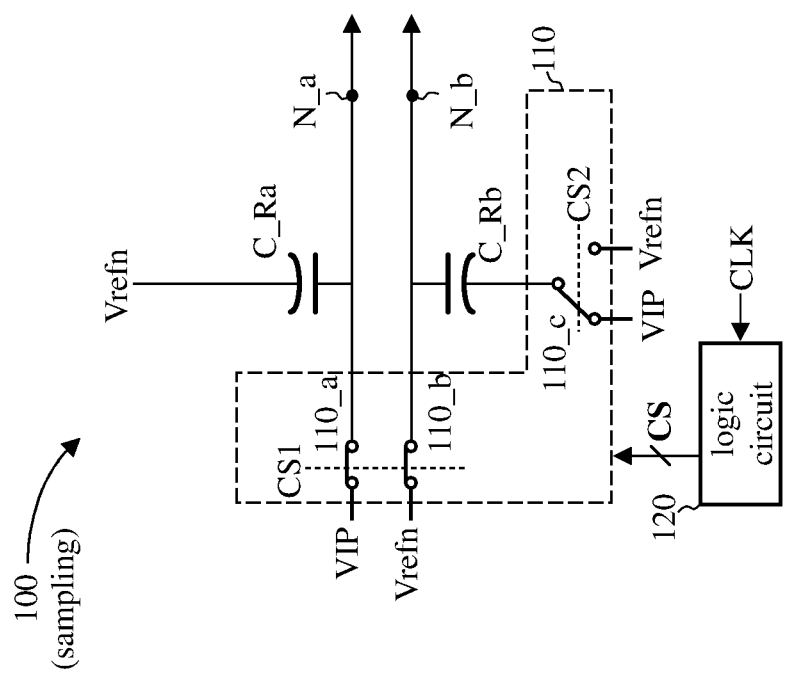

FIG. 1A and FIG. 1B are circuit diagrams of a single-ended to differential-ended converter circuit according to an embodiment of the present invention. The single-ended to differential-ended converter circuit 100 receives the single-ended signal VIP and the reference voltage Vrefn in the sampling phase (FIG. 1A), and outputs the signal VOP and the signal VON (collectively, the differential signal VO) from the output node N_a and the output node N_b in the hold phase (FIG. 1B). In other words, the single-ended to differential-ended converter circuit 100 converts the single-ended signal VIP into the differential signal VO. The single-ended to differential-ended converter circuit 100 includes a sampling capacitor C_Ra, a sampling capacitor C_Rb, a switch group 110, and a logic circuit 120. The switch group 110 includes a switch 110_a, a switch 110_b, and a switch 110_c. One end of the sampling capacitor C_Ra is coupled or electrically connected to the output node N_a, and the other end of the sampling capacitor C_Ra receives (i.e., is coupled to) the reference voltage Vrefn. One end of the sampling capacitor C_Rb is coupled or electrically connected to the output node N_b, and the other end of the sampling capacitor C_Rb receives, through the switch group 110 (specifically, through the switch 110_c), the single-ended signal VIP or the reference voltage Vrefn. The logic circuit 120 generates the control signal CS (including the control signal CS1 and the control signal CS2) according to the clock CLK. The switch 110_a and the switch 110_b are controlled by the control signal CS1, while the switch 110_c is controlled by the control signal CS2.

As shown in FIG. 1A, in the sampling phase, the logic circuit 120 controls the switch 110_a and the switch 110_b to be turned on, and controls the switch 110_c to switch to the single-ended signal VIP. In other words, in the sampling phase, the voltage at the output node N_a and the voltage at one end of the sampling capacitor C_Ra are identical to the single-ended signal VIP, the voltage at the output node N_b and the voltage at one end of the sampling capacitor C_Rb are identical to the reference voltage Vrefn, and the voltage at the other end of the sampling capacitor C_Rb is identical to the single-ended signal VIP.

As shown in FIG. 1B, in the hold phase, the logic circuit 120 controls the switch 110_a and the switch 110_b to be turned off, and controls the switch 110_c to switch to the reference voltage Vrefn. In other words, in the hold phase, the signal VOP is identical to the voltage at the output node N_a (i.e., the voltage at one end of the sampling capacitor C_Ra), the signal VON is identical to the voltage at the output node N_b (i.e., the voltage at one end of the sampling capacitor C_Rb), and the voltage at the other end of the sampling capacitor C_Rb is identical to the reference voltage Vrefn.

If the single-ended signal VIP=VCM+DELTA_V and the reference voltage Vrefn=VCM+VCMdelta, the differential signal VO is shown in equation (1).

$$\begin{cases} VOP = VCM + DELTA\_V \\ VON = \begin{array}{l}(VCM + VCMdelta) - DELTA\_V + \\ VCMdelta = VCM - DELTA\_V + 2 \times VCMdelta\end{array}\end{cases} \quad (1)$$

where VCM represents the common-mode voltage of the single-ended signal VIP (i.e., the middle voltage value of the swing of the single-ended signal VIP), DELTA_V represents the signal component of VIP, and VCMdelta represents the difference between the common-mode voltage of the single-ended signal VIP and the common-mode voltage of the reference voltage Vrefn.

The term "2*VCMdelta" in equation (1) is the conversion error amount of the single-ended to differential-ended converter circuit 100. As shown in equation (1), the differential signal VO is a differential signal (i.e., the signal VOP and the signal VON both contain the signal component DELTA_V), meaning that the single-ended to differential-ended converter circuit 100 converts the single-ended signal (VIP) into a differential signal (VO). Moreover, because the signal component of the differential signal VO (i.e., the difference between the signal VOP and the signal VON, which is 2*DELTA_V-2*VCMdelta) includes the term "2*DELTA_V," the single-ended to differential-ended converter circuit 100 has the effect of amplifying the single-ended signal VIP.

Figure 2B:
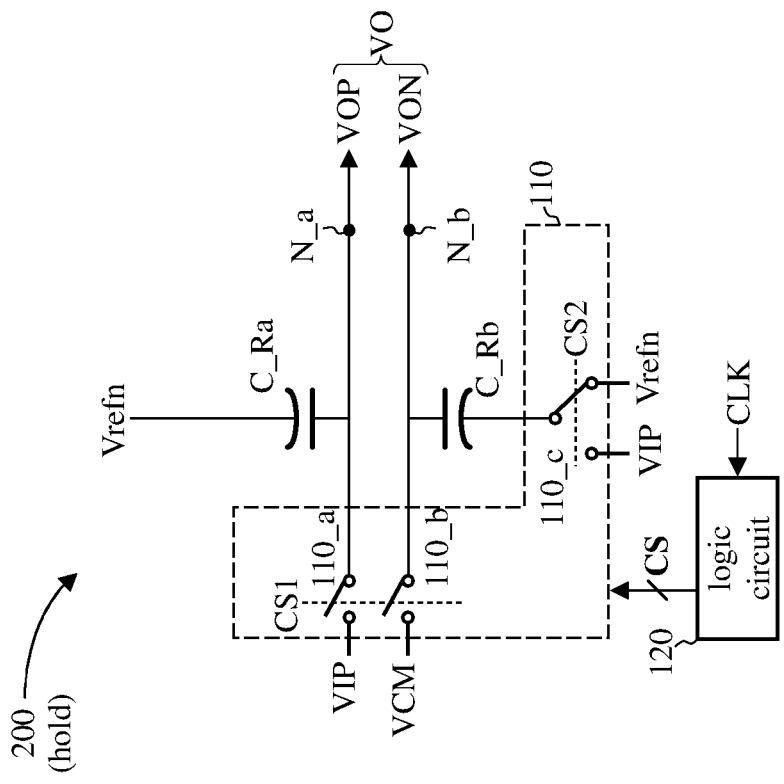
FIGS. 2A and 2B are circuit diagrams of a single-ended to differential-ended converter circuit according to another embodiment of the present invention.
Figure 2A:
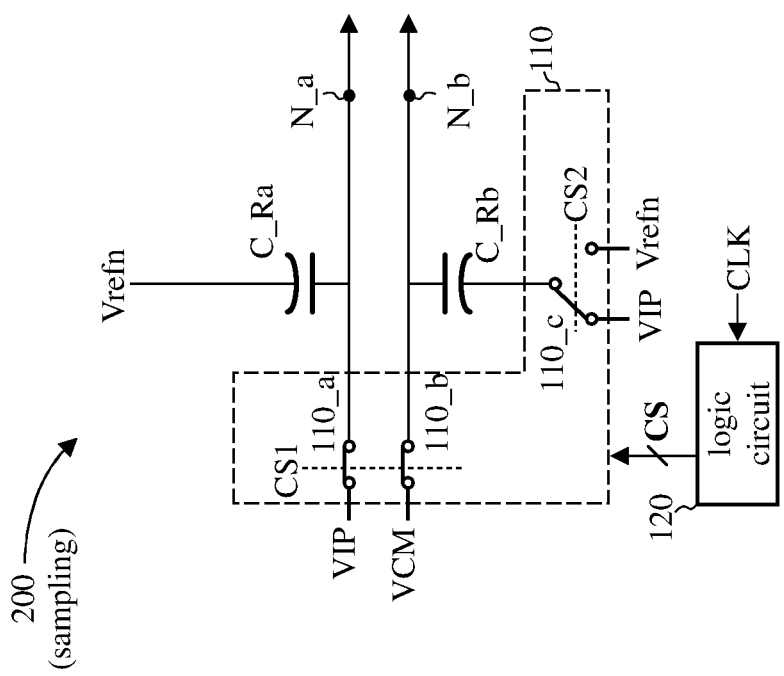

FIGS. 2A and 2B are circuit diagrams of a single-ended to differential-ended converter circuit according to another embodiment of the present invention. The single-ended to differential-ended converter circuit 200 is similar to the single-ended to differential-ended converter circuit 100, except that in the single-ended to differential-ended converter circuit 200, the switch 110_b couples the output node N_b to the common-mode voltage VCM of the single-ended signal VIP, instead of the reference voltage Vrefn. As a result, equation (1) becomes equation (2) below.

$$\begin{cases} VOP = VCM + \text{DELTA\_V} \\ VON = VCM - \text{DELTA\_V} + VCMdelta \end{cases} \quad (2)$$

The term "VCMdelta" in equation (2) is the conversion error amount of the single-ended to differential-ended converter circuit 200. The conversion error amount of the single-ended to differential-ended converter circuit 200 is less than that of the single-ended to differential-ended converter circuit 100. As shown in equation (2), similar to the single-ended to differential-ended converter circuit 100, the single-ended to differential-ended converter circuit 200 can not only convert the single-ended signal VIP into the differential signal VO but also amplify the single-ended signal VIP.

Figure 3A:
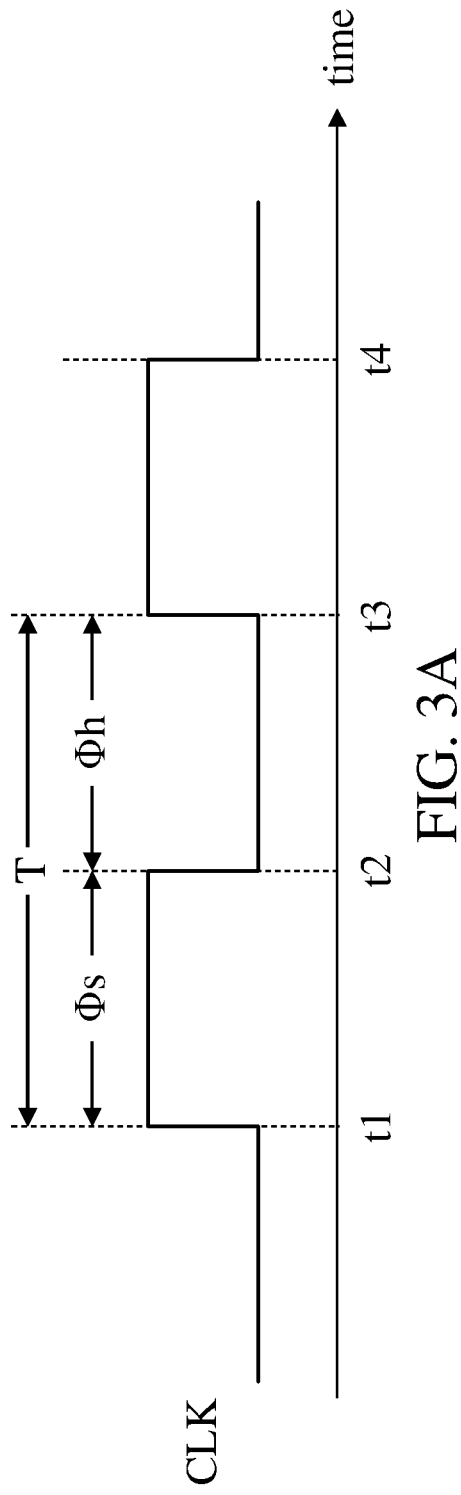
FIGS. 3A and 3B each show an embodiment of the clock CLK.
Figure 3B:
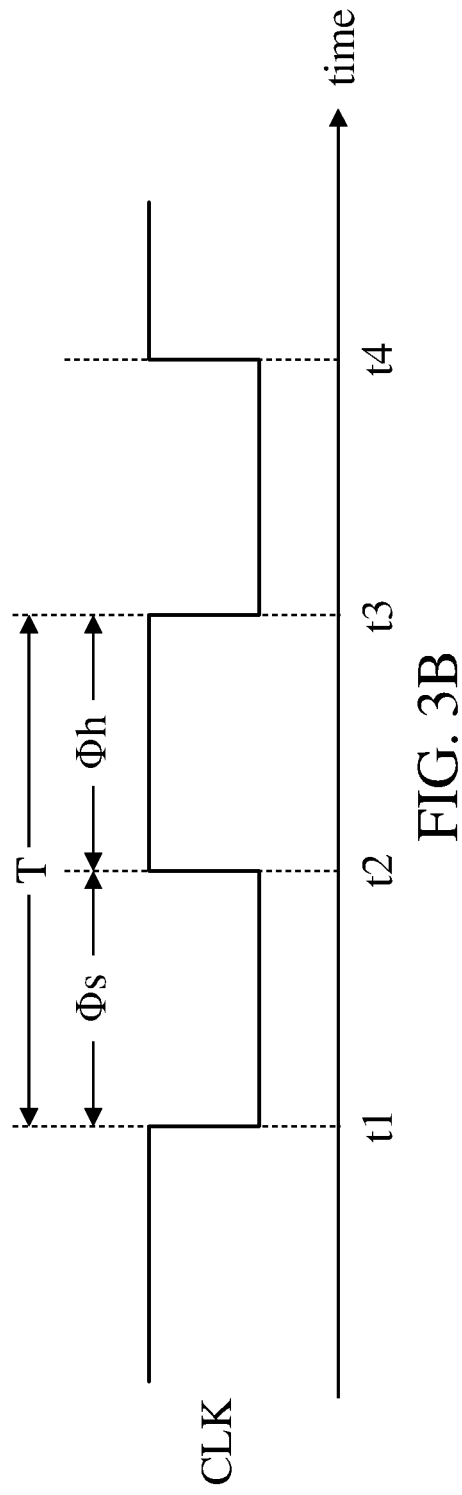

FIGS. 3A and 3B each show an embodiment of the clock CLK. The period of the clock CLK is T. "Φs" represents the sampling phase, while "Φh" represents the hold phase. The sampling phase Φs may correspond to the high level of the clock CLK (FIG. 3A), while the hold phase Φh may correspond to the low level of the clock CLK (FIG. 3A); alternatively, the sampling phase Φs may correspond to the low level of the clock CLK (FIG. 3B), while the hold phase Φh may correspond to the high level of the clock CLK (FIG. 3B). In other words, in some embodiments, the single-ended to differential-ended converter circuit 100 and the single-ended to differential-ended converter circuit 200 operate alternately in the sampling phase Φs and the hold phase Φh according to the clock CLK.

For FIG. 3A, at the rising edges of the clock CLK (time point t1, time point t3, . . . ), the logic circuit 120 controls the switch 110_a and the switch 110_b to be turned on and controls the switch 110_c to switch to the single-ended signal VIP; at the falling edges of the clock CLK (time point t2, time point t4, . . . ), the logic circuit 120 controls the switch 110_a and the switch 110_b to be turned off and controls the switch 110_c to switch to the reference voltage Vrefn.

For FIG. 3B, at the falling edges of the clock CLK (time point t1, time point t3, . . . ), the logic circuit 120 controls the switch 110_a and the switch 110_b to be turned on and controls the switch 110_c to switch to the single-ended signal VIP; at the rising edges of the clock CLK (time point t2, time point t4, . . . ), the logic circuit 120 controls the switch 110_a and the switch 110_b to be turned off and controls the switch 110_c to switch to the reference voltage Vrefn.

People having ordinary skill in the art can design the logic circuit 120 according to the above discussions; that is, the logic circuit 120 can be an application specific integrated circuit (ASIC) or embodied by circuits or hardware, such as a programmable logic device (PLD).

Figure 4B:
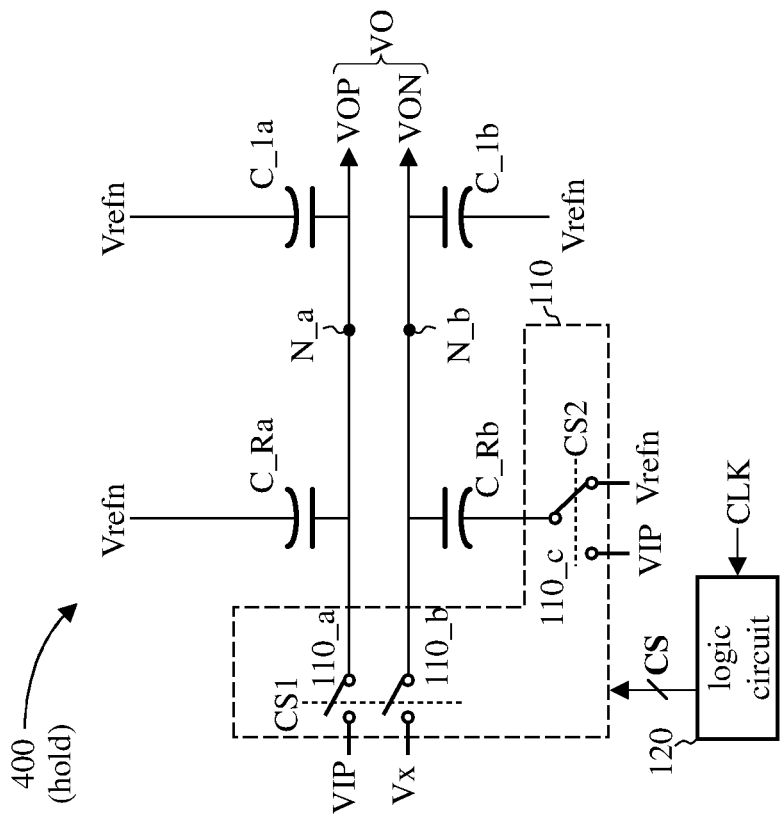
FIGS. 4A and 4B are circuit diagrams of a single-ended to differential-ended converter circuit according to another embodiment of the present invention.
Figure 4A:
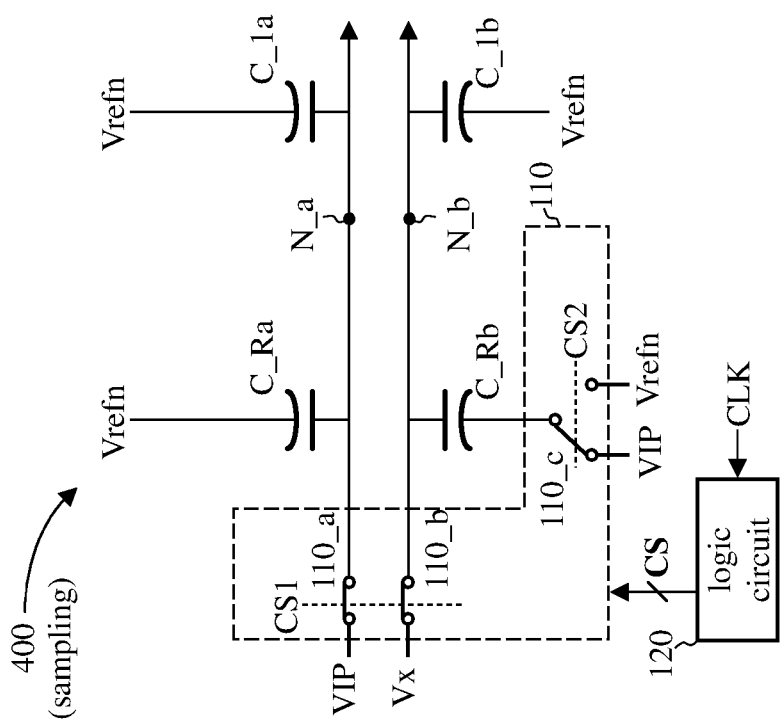

FIGS. 4A and 4B are circuit diagrams of a single-ended to differential-ended converter circuit according to another embodiment of the present invention. The single-ended to differential-ended converter circuit 400 is similar to the single-ended to differential-ended converter circuit 100 and the single-ended to differential-ended converter circuit 200, except that the single-ended to differential-ended converter circuit 400 further includes a capacitor C_1a and a capacitor C_1b. The voltage Vx may be the reference voltage Vrefn or the common-mode voltage VCM. One end of the capacitor C_1a is coupled or electrically connected to the output node N_a, and the other end of the capacitor C_1a receives the reference voltage Vrefn. One end of the capacitor C_1b is coupled or electrically connected to the output node N_b, and the other end of the capacitor C_1b receives the reference voltage Vrefn. In this embodiment, the differential signal VO can be adjusted by adjusting the ratio of the capacitance value of the sampling capacitor C_Ra (or the sampling capacitor C_Rb) to the capacitance value of the capacitor C_1a (or the capacitor C_1b). For example, when the capacitance values of the sampling capacitors C_Ra and C_Rb are both X units and the capacitance values of the capacitors C_1a and C_1b are both Y units, the signal component of the differential signal VO of the single-ended to differential-ended converter circuit 400 is X/(X+Y) times the signal component of the differential signal VO of the single-ended to differential-ended converter circuit 100 (or the single-ended to differential-ended converter circuit 200).

Figure 5:
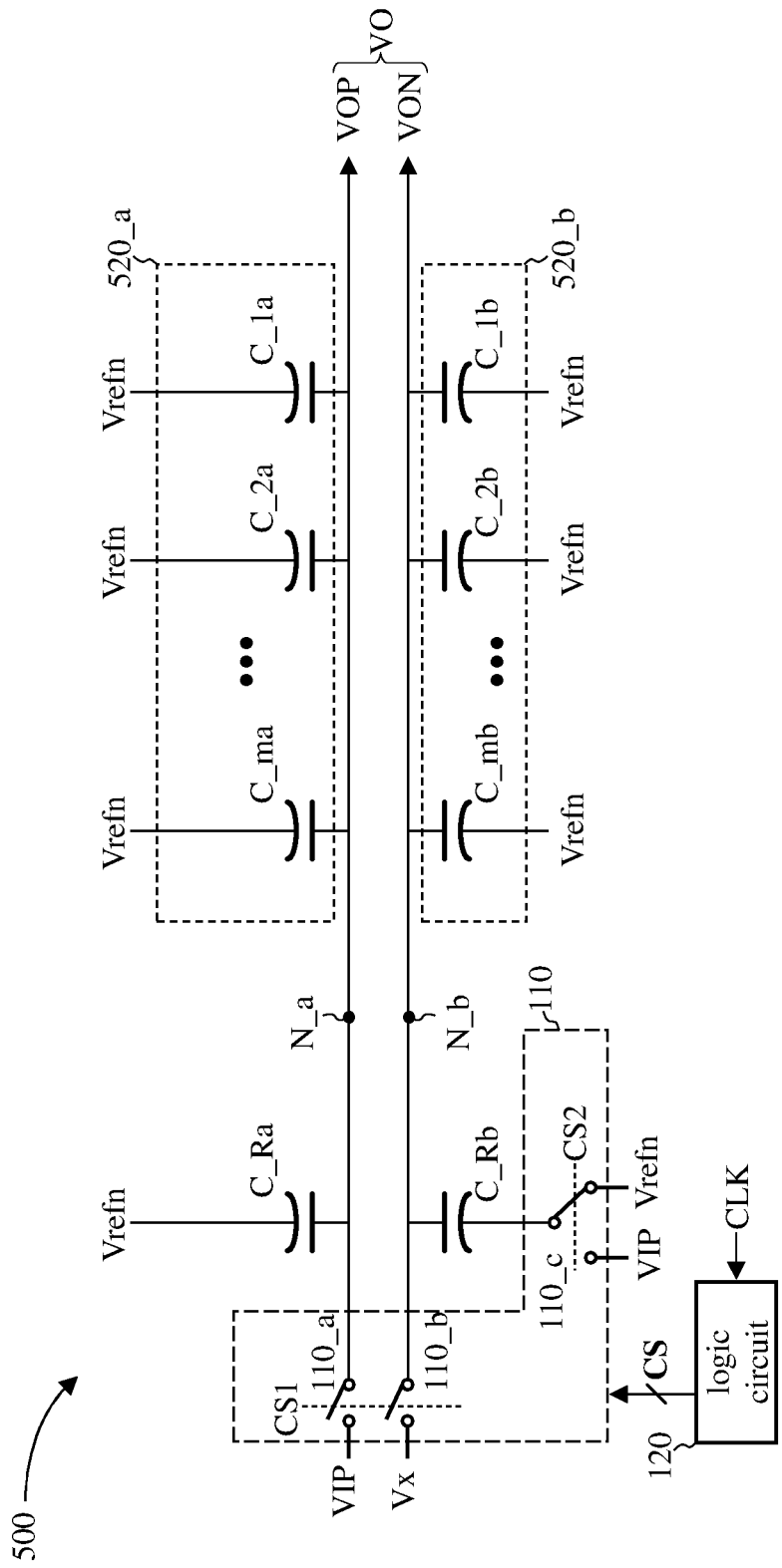
FIG. 5 is a circuit diagram of a single-ended to differential-ended converter circuit according to another embodiment of the present invention.

FIG. 5 is a circuit diagram of a single-ended to differential-ended converter circuit according to another embodiment of the present invention. The single-ended to differential-ended converter circuit 500 is similar to the single-ended to differential-ended converter circuit 100 (note that FIG. 5 shows only the hold phase), except that the single-ended to differential-ended converter circuit 500 further includes a capacitor group 520_a and a capacitor group 520_b. The capacitor group 520_a includes m first capacitors (C_1a, C_2a, . . . , C_ma, where m is an integer greater than one, and some components are omitted in the figure), while the capacitor group 520_b includes m second capacitors (C_1b, C_2b, . . . , C_mb, where m is an integer greater than one, and some components are omitted in the figure). One end of the first capacitors is coupled or electrically connected to the output node N_a, and the other end of the first capacitors receives the reference voltage Vrefn. One end of the second capacitors is coupled or electrically connected to the output node N_b, and the other end of the second capacitors receives the reference voltage Vrefn Similar to the single-ended to differential-ended converter circuit 400, the single-ended to differential-ended converter circuit 500 can adjust the magnitude of the signal component of the differential signal VO by adjusting the equivalent capacitance values of the capacitor group 520_a and the capacitor group 520_b.

In some embodiments, the capacitance values of the m first capacitors and the m second capacitors increase or decrease in a binary progression; for example, the capacitance values of the capacitors C_1a (C_1b), C_2a (C_2b), . . . , C_ma (C_mb) are 1C, 2C, 4C, . . . , $2^{m-1}$ C, respectively (C being the unit capacitance value).

Figure 6:
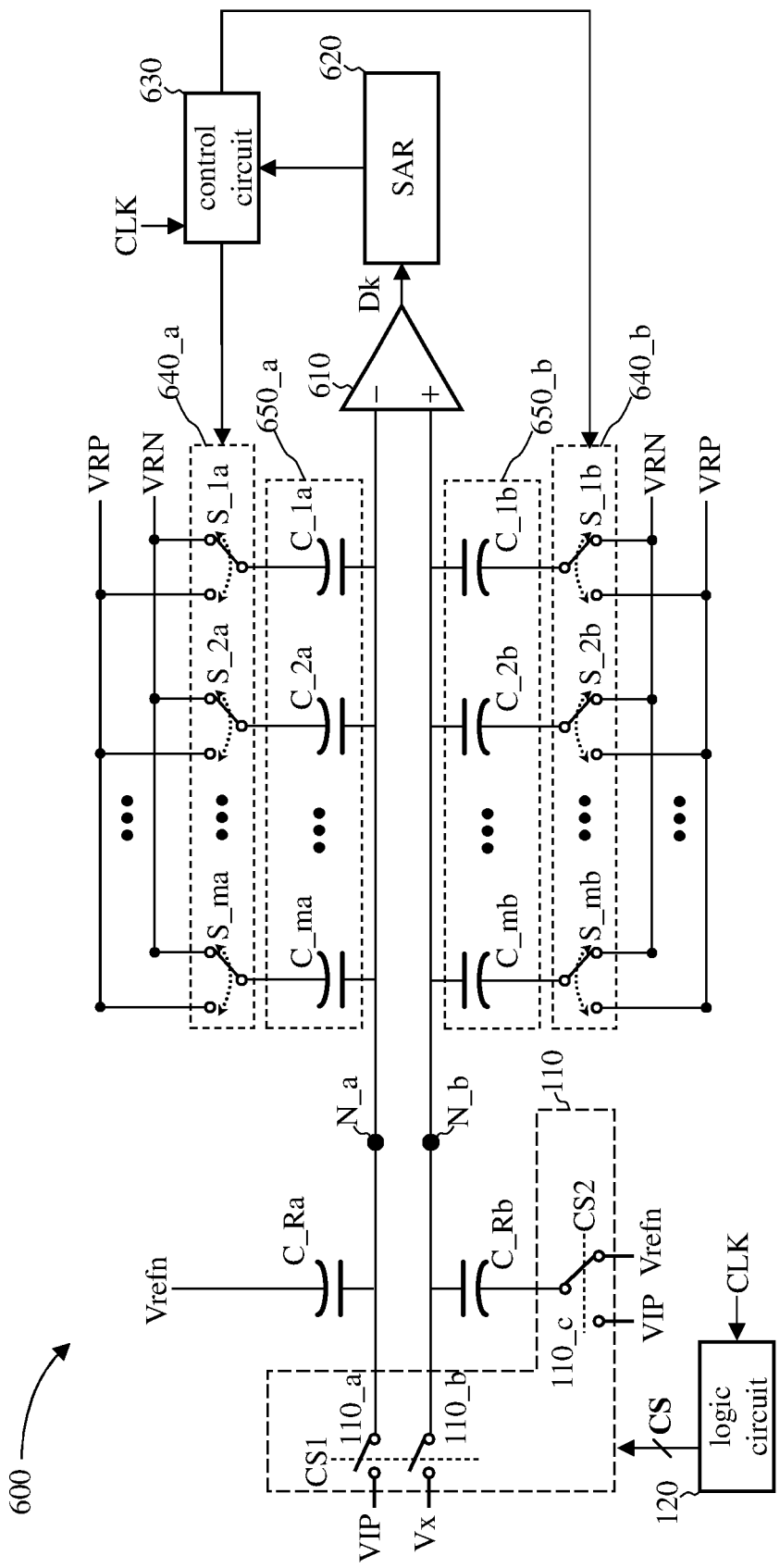
FIG. 6 is a circuit diagram of a SAR ADC according to an embodiment of the present invention.

FIG. 6 is a circuit diagram of a SAR ADC according to an embodiment of the present invention. The SAR ADC 600 employs the above-discussed single-ended to differential-ended converter circuit 100 or single-ended to differential-ended converter circuit 200 and further includes a comparator 610, a SAR 620, a control circuit 630, a switch group 640_a, a switch group 640_b, a capacitor group 650_a, and a capacitor group 650_b.

The switch group 640_a includes m first switches (S_1a, S_2a, . . . , S_ma, where m is an integer greater than one, and some components are omitted in the figure), and the switch group 640_b includes m second switches (S_1b, S_2b, . . . , S_mb, where m is an integer greater than one, and some components are omitted in the figure). The capacitor group 650_a (or the capacitor group 650_b) includes m first capacitors (or second capacitors), and one end of each first capacitors (or second capacitors) is coupled or electrically connected to the output node N_a (or the output node N_b), the other end of each first capacitor (or second capacitor) is coupled to the reference voltage VRP or the reference voltage VRN through their corresponding first switch (or second switch). In some embodiments, the reference voltage VRP is a high voltage, the reference voltage VRN is a low voltage, and the reference voltage Vrefn is not the reference voltage VRP and the reference voltage VRN.

The comparator 610 has a first input terminal (electrically connected to the output node N_a) and a second input terminal (electrically connected to the output node N_b). The comparator 610 compares the voltage at the output node N_a and the voltage at the output node N_b, and generates a comparison result Dk. The SAR 620, which is coupled to the comparator 610 and the control circuit 630, stores the comparison result Dk. The control circuit 630 controls the switch group 640_a and the switch group 640_b according to the register value(s) of the SAR 620 and the clock CLK. The details of the control of the switch group 640_a and the switch group 640_b by the control circuit 630 are well known to people having ordinary skill in the art and thus omitted for brevity.

Similarly, in some embodiments, the capacitance values of the m first capacitors and the m second capacitors increase or decrease in a binary progression.

Since the single-ended to differential-ended converter circuit 100 and the single-ended to differential-ended converter circuit 200 have the effect of amplifying the single-ended signal VIP, the SAR ADC 600 of the present invention has better performance (e.g., better SNR), compared to the SAR ADC that does not implement the single-ended to differential-ended conversion.

Figure 7:
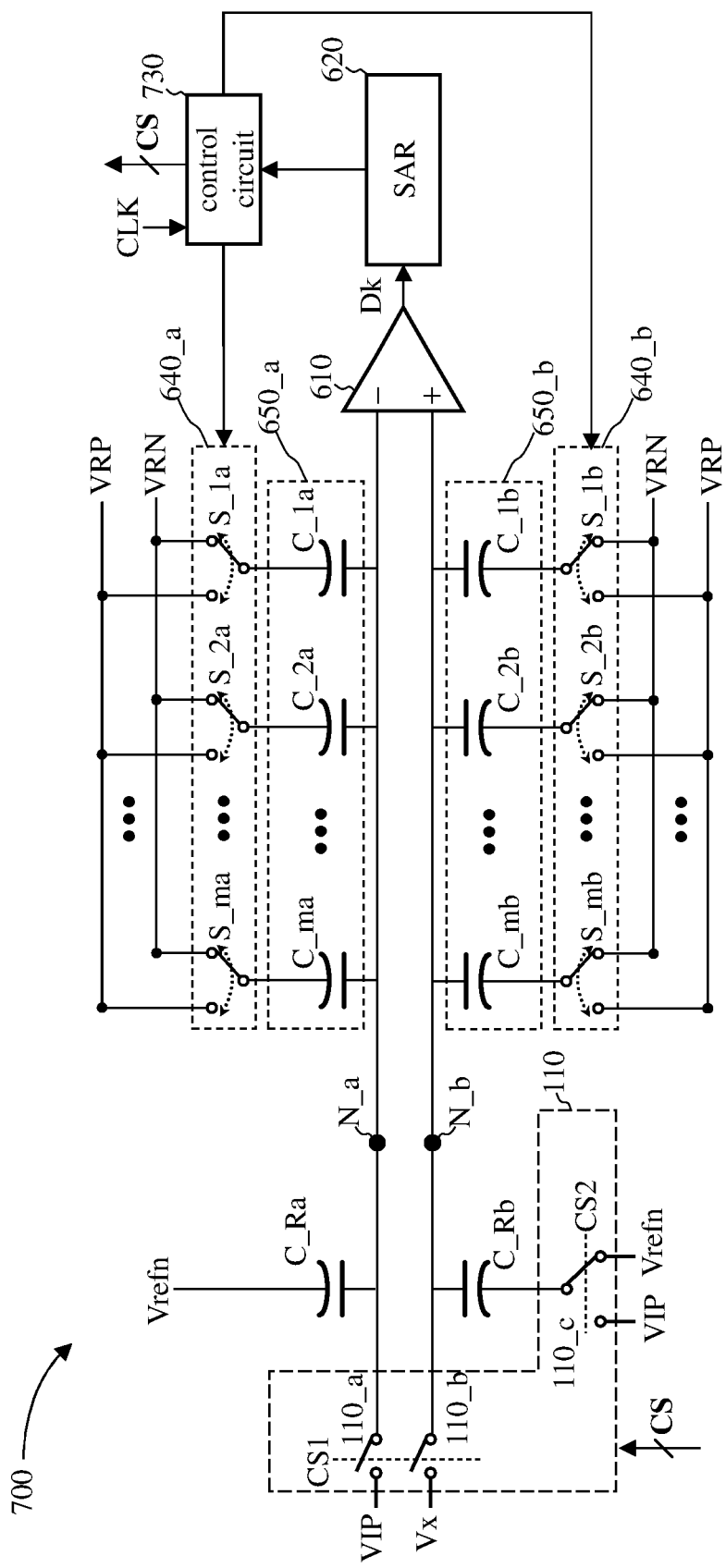
FIG. 7 is a circuit diagram of a SAR ADC according to another embodiment of the present invention.

FIG. 7 is a circuit diagram of a SAR ADC according to another embodiment of the present invention. The SAR ADC 700 is similar to the SAR ADC 600, except that in the embodiment of FIG. 7, the logic circuit 120 is integrated into the control circuit 730; therefore, the control circuit 730 further generates the control signal CS according to the clock CLK.

Figure 8:
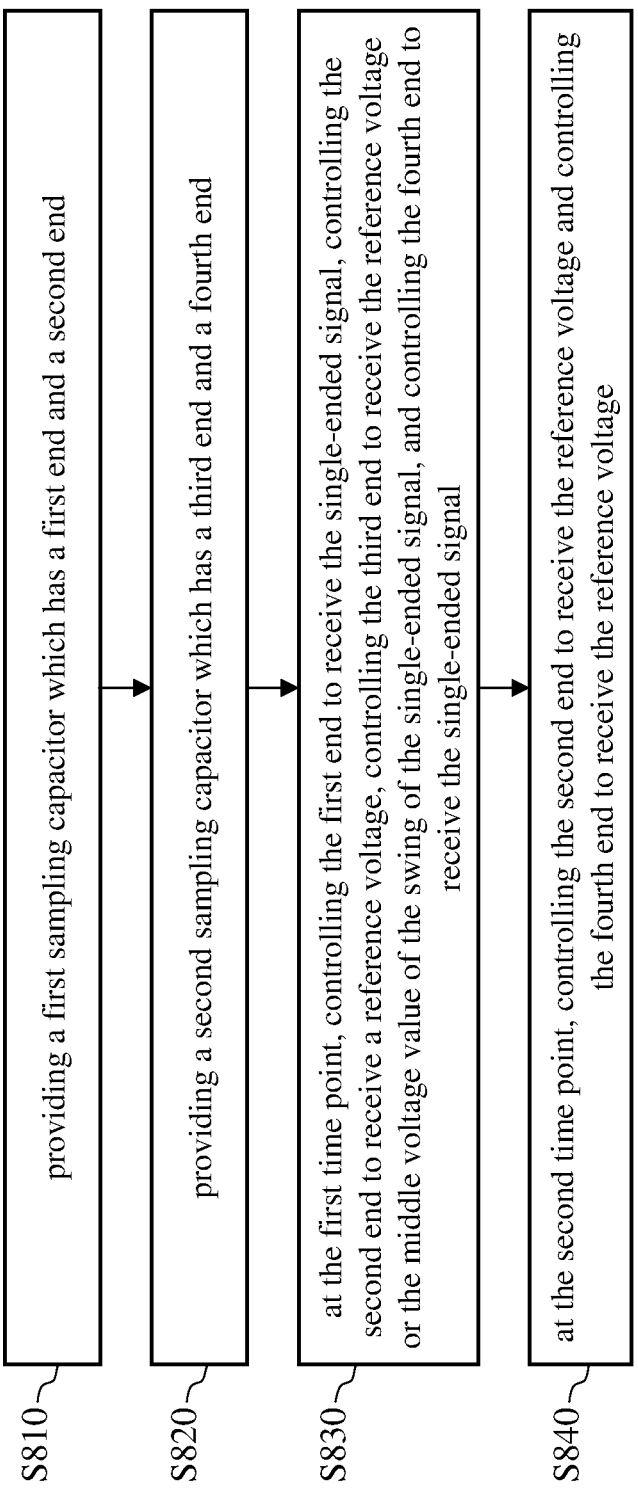
FIG. 8 is a flowchart of a method of converting a single-ended signal to a differential-ended signal according to an embodiment of the present invention.

FIG. 8 is a flowchart of a method of converting a single-ended signal to a differential-ended signal according to an embodiment of the present invention, which converts the single-ended signal VIP into the differential signal VO. The method includes the following steps.

Step S810: providing a first sampling capacitor C_Ra, which has a first end (i.e., the end coupled or electrically connected to the output node N_a) and a second end.

Step S820: providing a second sampling capacitor C_Rb, which has a third end (i.e., the end coupled or electrically connected to the output node N_b) and a fourth end.

Step S830: at the first time point t1, controlling the first end to receive the single-ended signal VIP, controlling the second end to receive the reference voltage Vrefn, controlling the third end to receive the reference voltage Vrefn (corresponding to FIGS. 1A and 1B) or the middle voltage value of the swing of the single-ended signal VIP (corresponding to FIGS. 2A and 2B), and controlling the fourth end to receive the single-ended signal VIP.

Step S840: at the second time point t2, controlling the second end to receive the reference voltage Vrefn and controlling the fourth end to receive the reference voltage Vrefn.

The second time point t2 is later than the first time point t1 (as shown in FIGS. 3A and 3B), and the differential signal VO after conversion is outputted from the first end and the second end after the second time point t2.

FIG. 9 is a flowchart of a method of converting a single-ended signal to a differential-ended signal according to another embodiment of the present invention. The method, which converts the single-ended signal VIP into the differential signal VO, includes steps S810-S820, S910-S920, and S830-S840. Since steps S810-S820 and S830-S840 are the same as those in FIG. 8, the details are not discussed herein again for brevity.

Step S910: providing a first capacitor C_1a, which has a fifth end and a sixth end, with the fifth end coupled or electrically connected to the first end, and the sixth end receiving the reference voltage Vrefn.

Step S920: providing a second capacitor C_1b, which has a seventh end and an eighth end, with the seventh end coupled or electrically connected to the third end, and the eighth end receiving the reference voltage Vrefn.

Since a person having ordinary skill in the art can appreciate the implementation detail and the modification thereto of the present method invention through the disclosure of the device invention, repeated and redundant description is thus omitted. Please note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A single-ended to differential-ended converter circuit for receiving a single-ended signal and outputting a differential signal at a first output node and a second output node, comprising:
    a first sampling capacitor having a first end and a second end, the first end being coupled to the first output node, and the second end receiving a reference voltage;
    a second sampling capacitor having a third end and a fourth end, the third end being coupled to the second output node;
    a switch group coupled to the first output node, the second output node, and the fourth end; and
    a logic circuit coupled to the switch group and configured to control the switch group according to a clock;
    wherein at a first time point, the switch group couples the first output node and the first end to the single-ended signal, couples the second output node and the third end to the reference voltage or a middle voltage value of a swing of the single-ended signal, and couples the fourth end to the single-ended signal;
    wherein at a second time point, the switch group couples the fourth end to the reference voltage; and
    wherein the differential signal is outputted after the second time point which is later than the first time point;

wherein the first time point corresponds to one of a rising edge and a falling edge of the clock, and the second time point corresponds to another of the rising edge and the falling edge of the clock.

2. The single-ended to differential-ended converter circuit of claim 1, wherein the switch group comprises:
a first switch coupled to the first output node and the first end;
a second switch coupled to the second output node and the third end; and
a third switch coupled to the fourth end;
wherein at the first time point, the first switch is turned on to couple the first output node and the first end to the single-ended signal, the second switch is turned on to couple the second output node and the third end to the reference voltage or the middle voltage value of the swing of the single-ended signal, and the third switch couples the fourth end to the single-ended signal; and
wherein at the second time point, the first switch and the second switch are turned off, and the third switch couples the fourth end to the reference voltage.

3. The single-ended to differential-ended converter circuit of claim 1 further comprising:
a first capacitor having a fifth end and a sixth end, the fifth end being coupled to the first output node, and the sixth end receiving the reference voltage; and
a second capacitor having a seventh end and an eighth end, the seventh end being coupled to the second output node, and the eighth end receiving the reference voltage.

4. The single-ended to differential-ended converter circuit of claim 1 further comprising:
a first capacitor group comprising a plurality of first capacitors, an end of the first capacitors being coupled to the first output node, and another end of the first capacitors being coupled to the reference voltage; and
a second capacitor group comprising a plurality of second capacitors, an end of the second capacitors being coupled to the second output node, and another end of the second capacitors being coupled to the reference voltage.

5. The single-ended to differential-ended converter circuit of claim 4, wherein capacitance values of the first capacitors increase in a binary progression, and capacitance values of the second capacitors increase in a binary progression.

6. A successive-approximation register (SAR) analog-to-digital converter (ADC), comprising:
a comparator having a first input terminal and a second input terminal and configured to generate a comparison result;
a SAR coupled to the comparator and configured to store the comparison result;
a first sampling capacitor having a first end and a second end, the first end being coupled to the first input terminal, and the second end receiving a reference voltage;
a second sampling capacitor having a third end and a fourth end, the third end being coupled to the second input terminal;
a first capacitor group comprising a plurality of first capacitors, an end of the first capacitors being coupled to the first input terminal;
a first switch group coupled to another end of the first capacitors;
a second capacitor group comprising a plurality of second capacitors, an end of the second capacitors being coupled to the second input terminal;
a second switch group coupled to another end of the second capacitors;
a control circuit coupled to the SAR and configured to control the first switch group and the second switch group according to the comparison result; and
a third switch group coupled to the first input terminal, the second input terminal, and the fourth end;
wherein at a first time point, the third switch group couples the first input terminal and the first end to a single-ended signal, couples the second input terminal and the third end to the reference voltage or a middle voltage value of a swing of the single-ended signal, and couples the fourth end to the single-ended signal;
wherein the third switch group couples the fourth end to the reference voltage at a second time point which is later than the first time point.

7. The SAR ADC of claim 6, wherein the third switch group comprises:
a first switch coupled to the first input terminal and the first end;
a second switch coupled to the second input terminal and the third end; and
a third switch coupled to the fourth end;
wherein at the first time point, the first switch is turned on to couple the first input terminal and the first end to the single-ended signal, the second switch is turned on to couple the second input terminal and the third end to the reference voltage or the middle voltage value of the swing of the single-ended signal, and the third switch couples the fourth end to the single-ended signal; and
wherein at the second time point, the first switch and the second switch are turned off, and the third switch couples the fourth end to the reference voltage.

8. The SAR ADC of claim 6, wherein capacitance values of the first capacitors increase in a binary progression, and capacitance values of the second capacitors increase in a binary progression.

9. The SAR ADC of claim 6 further comprising:
a logic circuit coupled to the third switch group and configured to control the third switch group according to a clock;
wherein the first time point corresponds to one of a rising edge and a falling edge of the clock, and the second time point corresponds to another of the rising edge and the falling edge of the clock.

10. A method of converting a single-ended signal to a differential signal, comprising:
providing a first sampling capacitor which has a first end and a second end;
providing a second sampling capacitor which has a third end and a fourth end;
at a first time point, controlling the first end to receive the single-ended signal, controlling the second end to receive a reference voltage, controlling the third end to receive the reference voltage or a middle voltage value of a swing of the single-ended signal, and controlling the fourth end to receive the single-ended signal; and
at a second time point, controlling the second end to receive the reference voltage and controlling the fourth end to receive the reference voltage;
wherein the first end and the third end output the differential signal after the second time point which is later than the first time point;
wherein the first time point corresponds to one of a rising edge and a falling edge of a clock, and the second time point corresponds to another of the rising edge and the falling edge of the clock.

11. The method of claim 10 further comprising:
providing a first capacitor which has a fifth end and a sixth end, the fifth end being coupled to the first end, and the sixth end receiving the reference voltage; and
providing a second capacitor which has a seventh end and an eighth end, the seventh end being coupled to the third end, and the eighth end receiving the reference voltage.

\* \* \* \* \*